United States Patent
Ueki et al.

(10) Patent No.: US 7,058,104 B2
(45) Date of Patent: Jun. 6, 2006

(54) SURFACE EMITTING SEMICONDUCTOR LASER AND METHOD OF FABRICATING THE SAME

(75) Inventors: Nobuaki Ueki, Kanagawa (JP); Hiromi Otoma, Kanagawa (JP); Akemi Murakami, Kanagawa (JP); Akira Sakamoto, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 162 days.

(21) Appl. No.: 10/375,110

(22) Filed: Feb. 28, 2003

(65) Prior Publication Data

US 2003/0202552 A1    Oct. 30, 2003

(30) Foreign Application Priority Data

Apr. 26, 2002  (JP)  ............... 2002-127680

(51) Int. Cl.
*H01S 5/00* (2006.01)

(52) U.S. Cl. ............... 372/44.01; 372/46.013; 372/50.1

(58) Field of Classification Search ............ 372/44–46, 372/50, 46.013, 50.1, 46.01
See application file for complete search history.

(56) References Cited

U.S. PATENT DOCUMENTS

| 5,638,392 A | * | 6/1997 | Ramdani et al. ............... 372/45 |
| 5,748,661 A | * | 5/1998 | Kiely et al. .................... 372/50 |
| 5,903,588 A | * | 5/1999 | Guenter et al. ......... 372/46.013 |
| 6,184,066 B1 | | 2/2001 | Chino et al. |
| 6,611,003 B1 | | 8/2003 | Hatakoshi et al. |
| 6,654,396 B1 | * | 11/2003 | Hoshi et al. .................. 372/46 |
| 6,658,040 B1 | | 12/2003 | Hu et al. |
| 6,687,268 B1 | | 2/2004 | Kitamura et al. |
| 6,912,236 B1 | | 6/2005 | Shimizu et al. |
| 2001/0026567 A1 | | 10/2001 | Kaneko et al. |
| 2002/0101899 A1 | * | 8/2002 | Yokouchi et al. ............. 372/46 |

FOREIGN PATENT DOCUMENTS

| DE | 101 36 334 A1 | 2/2002 |
| EP | 0 704 947 A1 | 4/1996 |
| EP | 0 881 671 A2 | 12/1998 |
| JP | A 9-223841 | 8/1997 |
| JP | 10-335383 | 12/1998 |
| JP | 11-266058 | 9/1999 |
| JP | 2000-22277 | 1/2000 |
| JP | 2001-102673 | 4/2001 |
| JP | 2002-118329 | 4/2002 |
| JP | 2002-368334 | 12/2002 |
| JP | A 2002-353561 | 12/2002 |
| JP | 2003-179308 | 6/2003 |

* cited by examiner

*Primary Examiner*—James Menefee
(74) *Attorney, Agent, or Firm*—Oliff & Berridge, PLC

(57) ABSTRACT

A surface emitting semiconductor laser includes a substrate, a laser portion having a first post construction that is provided on the substrate and has a contact region on a top surface thereof, and an electrode portion having a second post construction provided on the substrate. The electrode portion includes a conductive layer electrically connected to the contact region and extends therefrom.

15 Claims, 7 Drawing Sheets

- 30 ELECTRODE PAD PART
- 20 LASER ELEMENT PART
- 14 BONDING WIRE
- 13 METAL BALL
- 7 INTERLAYER INSULATING FILM
- 6 CONTACT LAYER
- 5 UPPER MULTILAYER REFLECTION FILM
- 3 ACTIVE REGION
- 2 LOWER MULTILAYER REFLECTION FILM
- 1 SEMICONDUCTOR SUBSTRATE
- 12 n-SIDE ELECTRODE

- 15 LIGHT EMITTING APERTURE
- 9 RING ELECTRODE
- 10 EXTRACTION LINE
- 11 ELECTRODE PAD
- 20 LASER ELEMENT PART
- 30 ELECTRODE PAD PART

SURFACE EMITTING SEMICONDUCTOR LASER AND METHOD OF FABRICATING THE SAME

BACKGROUND OF THE INVENTION

1. Field of the Invention

The present invention relates to a surface emitting semiconductor laser used as a source for optical information processing and optical communications and a method of fabricating such a laser. More particularly, the present invention relates to the structure of electrode pads for bonding interconnections employed in the surface emitting semiconductor laser.

2. Description of the Related Art

Recently, there has been an increased demand for a surface emitting semiconductor laser capable of easily realizing an array of sources in the technical fields of optical communications and optical interconnections. Hereinafter, the surface emitting semiconductor laser includes both a surface emitting semiconductor laser itself and a device employing the laser. The multiplied sources enable parallel transmission (parallel processing) of data, so that the transmission capacity and rate can be drastically enhanced.

The surface emitting semiconductor laser needs a current confinement structure capable of efficiently confining current in the active layer. A method of selectively oxidizing a semiconductor layer containing aluminum is known as means for confining current.

This type of laser having the refractive-index waveguide structure employs a waveguide defined by selectively oxidizing part of a multilayered semiconductor reflection film in the vicinity of the active layer so that a high-resistance region can be defined. Further, the high-resistance region is processed so as to have a reduced refractive index value. The above waveguide provides the strong optical confinement effect, and thus realizes excellent performance of low threshold current and high responsibility.

FIG. 8A is a cross-sectional view of a conventional selective oxidization type surface emitting laser having a laser portion defined by a post construction such as a mesa shape including a circular or rectangular post obtained by removing the periphery of the laser portion. FIG. 8B is a plan view of the laser shown in FIG. 8A. A surface emitting semiconductor laser 100 has an upper-emission type laser portion 102 having a post construction including a selectively oxidized region 110 formed on a semiconductor substrate 101. A metal layer 104 is connected to a contact region 103 on the top surface of the laser portion 102. The metal layer 104 extends to an electrode pad portion 105 via an electrode extraction line 106. The metal layer 104 defines a square bonding pad 107 in the electrode pad portion 105. A metal ball 109 connected to an end of a bonding wire 108 is bonded to the bonding pad 107.

The electrode pad portion 105 is located on the flat surface that is the bottom of the mesa structure spaced apart from the laser portion 102. The above arrangement results in an electrostatic capacitance coupled to the laser part 102 and another electrostatic capacitance (stray capacitance) resulting from the electrode pad portion 105. If the laser is driven (modulated) at a high speed, the responsibility will be degraded depending on the RC time constant.

The surface emitting laser diode shown in FIGS. 8A and 8B has another disadvantage. In the process of etching the laminated layers formed on the semiconductor substrate 101 to thus define the post construction, a semiconductor layer 111 of AlGaAs is revealed on the semiconductor substrate 101. An AlGaAs layer contained in the post construction is oxidized from the side surface thereof in order to define the current confinement layer. In the above oxidization process, part of the AlGaAs layer 111 revealed on the semiconductor layer 101 is simultaneously oxidized. Then, an interlayer insulating film 112 made of, for example, $SiN_x$ is laminated on the partially oxidized AlGaAs layer 111, and the metal layer 104 serving as a bonding electrode is deposited thereon. However, the interlayer insulating film 112 does not adhere to the surface (AlGaAs layer) of the wafer after etching very well, and is liable to be removed therefrom. Thus, the above structure does not have a satisfactory strength as the bonding pad electrode.

A method for improving the adhesiveness has been widely utilized. The proposed method fills in the etched region with polyimide to lengthen the distance between the metal electrode and the substrate surface, so that the electrostatic capacitance resulting from the electrode pad portion 105 can be reduced. Although polyimide does not necessarily have good adhesiveness to the semiconductor material, it has a viscosity as a nature of material. In terms of the above fact, polyimide has an advantage of being less affected by the surface condition and composition of the material to which polyimide adheres.

However, it is very difficult to keep the surface flatness of the polyimide layer in the process of fabricating the surface emitting semiconductor laser having unevenness in which steps are as large as a few microns. This causes unevenness in the film thickness on the wafer and makes it difficult to produce the laser having even performance. There is another disadvantage mentioned below. It is required to increase the polyimide layer in order to reduce the stray capacitance as much as possible. If the polyimide layer is too thick, material is liable to gather in the periphery of the laser portion having an aperture via which light is emitted. The material that gathers in the periphery of the laser portion may cause a step-like breakage in the contact part and contaminate the aperture. This degrades the yield. There is yet another disadvantage due to the difference in the coefficient of thermal expansion between polyimide and the semiconductor materials used to form the surface emitting laser diode. This difference generates heat in operation, resulting in stress in the vicinity of the interface. The stress degrades the device performance. In addition, the use of polyimide increases the number of production steps and cost. This is a factor that should be avoided in mass production although it may be accepted in the stages of research and development. As described above, the use of polyimide does not achieve good reproducibility and even performance, and is not balanced against the troublesome and expensive process.

There is another proposal described in, for example, Japanese Unexamined Patent Publication No. 9-223841. This proposal shows a surface emitting semiconductor laser having a trench structure in which holes or grooves are partially formed in the periphery of the laser portion. More specifically, a surface emitting semiconductor laser described in the proposal employs grooves on both sides of an electrode extraction part that extends from the laser portion in order to improve the yield. When AlAs in the laser portion is subject to oxidization, AlAs in the electrode extraction part is totally oxidized.

However, the proposed surface emitting semiconductor laser still has a problem about the electrostatic capacitance resulting from the electrode pad portion, and cannot operate the laser portion at high speed.

SUMMARY OF THE INVENTION

The present invention has been made in view of the above circumstances and provides a surface emitting semiconductor laser and a method of fabricating the same.

More particularly, the present invention provides a surface emitting semiconductor laser having a post construction wherein the reduced stray capacitance resulting from the electrode pad portion can be reduced nevertheless it has a simple structure and a lot of lasers having even characteristics can be manufactured with a high yield.

According to an aspect of the present invention, a surface emitting semiconductor laser has: a substrate; a laser portion having a first post construction that is provided on the substrate and has a contact region on a top surface thereof; and an electrode portion having a second post construction provided on the substrate, the electrode portion including a conductor layer electrically connected to the contact region and extends therefrom.

According to another aspect of the present invention, a surface emitting semiconductor laser includes: a first multilayer reflection film, an oxidization control layer, an active layer and a second multilayer reflection film that are laminated; a laser portion that includes a first post construction formed by removing, in a periphery thereof, a range of at least the first multilayer reflection film to the oxidization control layer and has a first conduction type contact region formed on a top surface of the first multilayer reflection film; and an electrode portion that includes a second post construction formed by removing, in a periphery thereof, a range of at least the first multilayer reflection film to the oxidization control layer and has an electrode layer connected to the first conduction type contact region formed on the first multilayer reflection film via an insulating film.

According to yet another aspect of the present invention, a surface emitting semiconductor laser comprising: a laser portion that is provided on a semiconductor substrate and has a current confinement portion defined by selectively oxidizing part of a semiconductor layer containing aluminum; and an electrode portion for supplying the laser portion with current, the electrode portion having an oxide region defined by oxidizing another part of the semiconductor layer containing aluminum, the current confinement portion being separate from the oxide region.

According to a further aspect of the present invention, a surface emitting semiconductor laser comprising: a first multilayer reflection film, an oxidization control layer, an active layer and a second multilayer reflection film that are laminated; a laser portion that includes a first post construction formed by removing, in a periphery thereof, a range of at least the first multilayer reflection film to the oxidization control layer and has a first conduction type contact region formed on a top surface of the first multilayer reflection film; a first electrode portion that includes a second post construction formed by removing, in a periphery thereof, a range of at least the first multilayer reflection film to the oxidization control layer, the first electrode portion having an electrode layer provided on a top surface of the first multilayer reflection film via an insulation film and being connected to the first conduction type contact region; a second conduction type contact region formed on a side of the second multilayer reflection film; and a second electrode portion that includes a third construction formed by removing, in a periphery thereof, a range of at least the first multilayer reflection film to the oxidization control layer and has an electrode layer connected to the second conduction type contact region formed on the first multilayer reflection film via the insulating film and to the second conduction type contact region.

According to another aspect of the present invention, a method of fabricating a surface emitting semiconductor laser comprising the steps of: forming a multilayer structure on a substrate, the multilayer structure including a semiconductor layer containing aluminum and semiconductor layers of first and second conduction types; forming first and second post constructions on the substrate by etching the multilayer structure so that a side surface of the semiconductor layer containing aluminum is exposed; oxidizing the semiconductor layer containing aluminum included in the first and second post constructions from side surfaces thereof; forming an insulating film on the substrate including the first and second post constructions; removing the insulating film from a top surface of the first post construction so that part of the semiconductor layer of the first conduction type in the first post construction is exposed; and depositing a metal layer extending from an exposed portion of the semiconductor layer of the first conduction type in the first post construction to a top of the second post construction.

BRIEF DESCRIPTION OF THE DRAWINGS

Preferred embodiments of the present invention will be described in detail based on the following figures, wherein.

DESCRIPTION OF THE PREFERRED EMBODIMENTS

A surface emitting semiconductor laser of the present invention is a so-called oxide-confined VCSEL (Vertical Cavity Surface Emitting Laser). A laser portion and an electrode portion have respective post constructions, which may have mesa structures. The post construction is defined as a construction in which the periphery of the post has been removed, and is physically separated or spaced apart from the periphery. Forming the post construction may result in a groove or trench in the vicinity of the post. There are no particular limitations on the size, shape and depth of the groove or trench.

Preferably, the substrate is a semiconductor substrate. Alternatively, an insulator substrate may be used. The use of the insulator substrate needs a contact layer provided on the front surface thereof rather than the back surface. In this case, an aperture via which laser is emitted may be provided on the back side of the insulator substrate. The semiconductor substrate may be made of, for example, GaAs, InP, AlGaAs.

The respective post constructions of the laser portion and the electrode portion include multiple common layers laminated on the substrate. The post constructions are covered by an insulating film made of, for example, $SiN_x$ or $SiO_2$. An electrode pad surface is formed on the insulating film on the top surface of the post construction in the electrode portion. A current confinement portion is formed by selectively oxidizing an AlAs layer in the laser portion. An AlAs layer of the electrode portion is simultaneously oxidized. The oxide layer thus formed contributes to reducing the electrostatic capacitance coupled to the electrode portion.

The post construction of the electrode portion may be made of multiple posts. By dividing the post construction into multiple posts having an appropriate width, the AlAs layers of the divided posts may be perfectly oxidized. A metal layer provided to the post construction of the electrode portion may be an electrode pad surface to which a wire is bonded, or an electrode surface to which a metal bump is bonded.

A description will now be given, with reference to the accompanying drawings, of embodiments of the present invention.

Figure 1A:
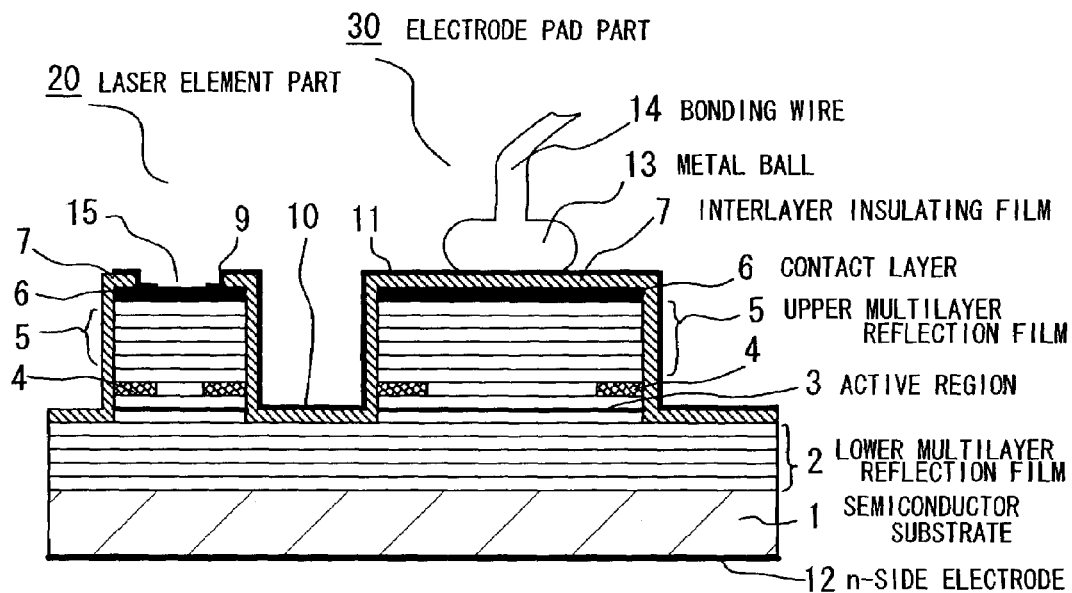
FIG. 1A is a cross-sectional view of a surface emitting semiconductor laser according to a first embodiment of the present invention.
Figure 1B:
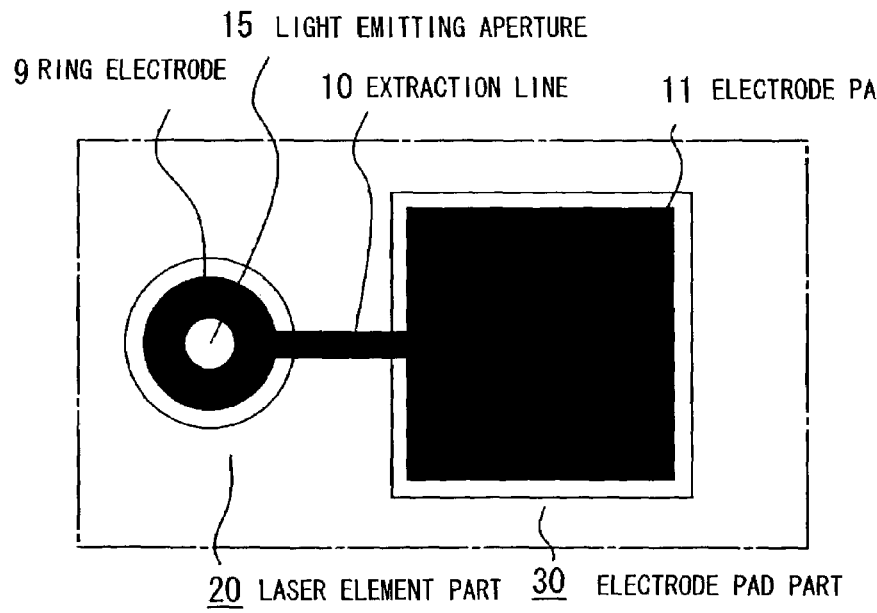
FIG. 1B is a plan view of the surface emitting semiconductor layer shown in FIG. 1A.

FIG. 1A is a cross-sectional view of a surface emitting semiconductor laser according to a first embodiment of the present invention, and FIG. 1B is a plan view of the laser shown in FIG. 1A. The laser includes an n-type GaAs substrate 1, an n-type lower multilayer semiconductor reflection layer 2, an active region 3, a current confinement/stray capacitance reduction portion 4, a p-type upper multilayer reflection film 5, a p-type contact layer 6, an interlayer insulating layer 7, a p-type ring-shaped electrode 9, an extraction line 10, an electrode pad 11, an n-side full-surface electrode 12, and a light emitting aperture 15. The active region 3 is a laminate of an undoped spacer layer, an undoped quantum well layer and an undoped barrier layer. The current confinement/stray capacitance reduction portion 4 is formed by an AlAs oxide. From this viewpoint, the current confinement/stray capacitance reduction portion may be called oxidization control layer. The extraction line 10 is extracted from the ring-shaped electrode 9. The electrode pad 11 continuously extends from the extraction line 10. A metal ball 13 is provided on the electrode pad 11, and is attached to the tip end of a bonding wire 14.

The laser has a laser portion 20. The laser portion 20 forms an oxide-confined VCSEL having a semiconductor laminate post defined by etching the semiconductor layers laminated on the semiconductor substrate 1. The semiconductor laminate post may be called post shape, post construction, mesa, mesa type or the like. An AlAs semiconductor layer in the post is partially oxidized, a resultant oxide serving as the current confinement layer 4. Thus, it is possible to realize efficient current and light confinement and achieve stable lateral-mode laser oscillation with a low threshold current. In contrast, the oxidized portion of the AlAs layer is a factor of electrostatic capacitance that is parasitic on the laser portion 20 in view of equivalent circuit. If the oxidized portion of the AlAs layer is too large, it may block high-speed modulation together with stray capacitance resulting from the electrode pad portion 30.

The ring-shaped electrode 9, which may be called contact electrode, is used to provide current to the laser portion 20. The ring-shaped electrode 9 is connected to the p-type contact layer 6 that is located on the top of the laser portion 20. When the device is attached to a holding tool such as a stem in practice, the bonding wire may directly be attached to the contact electrode 9. However, this style of bonding needs a very wide area of the contact electrode 9. This is not practical in terms of production process and performance.

Taking into consideration the above, the present invention employs an electrode pad portion 30 provided separate from the laser portion 20. The electrode pad portion 30 is used to attach a bonding wire to the laser, and has the same post construction as that of the laser portion 20 and the same laminate as that thereof. This means that the post construction of the electrode pad portion 30 has an oxide region 4 obtained by oxidizing part of the AlAs semiconductor layer. The oxidized region 4 of the electrode pad portion 30 corresponds to the current confinement layer portion 4 of the laser portion 20. The oxidized region 4 of the electrode pad portion 30 is not provided with current because the top of the post construction is covered by the interlayer insulating film 7. Therefore, the AlAs oxide region 4 provided in the electrode pad portion 30 is not involved in current confinement, but results in electrostatic capacitance together with the interlayer insulating film 7 that covers the top of the post construction.

According to the teaching of the electric circuit theory, a combined capacitance C of elements having capacitive reactances of electrostatic capacitances C1 and C2 connected in series is given as follows:

1/C=1/C1+1/C2.

When a finite number of C1 and C2 is given, a relationship of C<C1, C2 always stands. Thus, when another capacitive element is added to a capacitive element of interest, the combined capacitance is smaller than the capacitances of the individual capacitive capacitances.

Based on the above principle, according to the present invention, the AlAs oxide region 4 (FIG. 3A) is provided in the electrode pad portion 30 so as to be connected in series to the interlayer insulating film 7. Hereinafter, the AlAs oxide region in the electrode pad portion 30 is given a reference numeral 4a in order to discriminate the AlAs oxide region 4 in the laser portion 20. The AlAs oxide region 4a serves as a stray capacitance reduction part and thus reduces the stray capacitance resulting from the electrode pad portion 30 used for wire bonding. Further, the following advantages due to separation of the electrode pad portion 30 from the laser portion 20 have been confirmed.

The laser portion 20 is formed by etching and thermal treatment. In many cases, the surface of the wafer exposed by etching is AlGaAs (typical material used in the surface emitting semiconductor laser). The semiconductor layer containing Al is liable to be oxidized in thermal treatment. In the conventional structure, the electrode pad portion is substantially formed on the semiconductor layer having the oxidized surface. The interlayer insulating film is deposited on the semiconductor layer exposed by etching, and the metal electrode serving as the electrode pad is evaporated thereon.

However, good adhesiveness cannot be obtained between the oxidized semiconductor surface (AlGaAs) and the interlayer insulating film ($SiN_x$ or the like) deposited thereon. The following frequently occurs. When a metal wire is bonded to the electrode pad, the interlayer insulating film is pulled and removed from the semiconductor surface This causes removal of the interlayer insulating film or removal of the electrode pad due to deformation of the interlayer insulating film.

The electrode pad portion 30 differs from the conventional electrode pad portion in that the electrode pad portion 30 includes the (second) post construction that is separate from the laser portion 20 and the top of the second post construction is not subject to etching but is the p-type GaAs contact layer 6. The contact layer 6 is the same as the contact layer 6 of the laser portion 20, and is covered by a protection film during etching and thermal treatment. Thus, the surface of the contact layer 6 in the electrode pad portion 30 is not oxidized but is kept clean without any chemical alteration. By providing the interlayer insulating film 7 and the electrode pad 11 on the contact layer 6, the adhesiveness therebetween can be drastically improved and unwanted removal caused by wire bonding can be eliminated.

A description will now be given, with reference to FIGS. 2A through 2C and 3A through 3C, of a method of fabricating the surface emitting semiconductor laser according to the first embodiment of the present invention. FIGS. 2A through 2C and 3A through 3C show steps of the method of the 850 nm surface emitting semiconductor laser having the structure shown in FIGS. 1A and 1B.

Figure 2A:
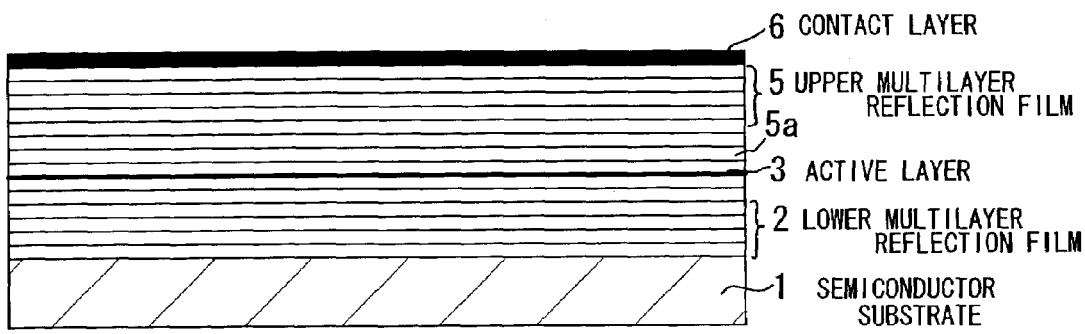
FIGS. 2A, 2B and 2C are cross-sectional views that show a method of fabricating the semiconductor laser shown in FIGS. 1A and 1B.

First, as is shown in FIG. 2A, the n-type lower multilayer reflection film 2, the undoped active region 3, the p-type upper multilayer reflection film 5 and the p-type contact layer 6 are laminated on the (100) surface of the n-type GaAs substrate 1 in this order by MOCVD (Metalorganic Chemical Vapor Deposition), so that a multilayer structure made up of these layers can be formed on the substrate 1.

The lower multilayer reflection film 2 is made up of multiple pairs of an n-type $Al_{0.9}Ga_{0.1}As$ layer and an n-type $Al_{0.15}Ga_{0.85}As$ layer. Each layer is $\lambda/4n_r$ thick where $\lambda$ is the oscillation wavelength and $n_r$ is the refractive index of the medium. The paired layers having different composition ratios are alternately laminated to a thickness of 40.5 periods. The carrier concentration of the lower multilayer reflection film 2 after silicon that is an n-type impurity is doped is $3 \times 10^{18}$ $cm^{-3}$.

The upper multilayer reflection film 5 is made up of multiple pairs of a p-type $Al_{0.9}Ga_{0.1}As$ layer and a p-type $Al_{0.15}Ga_{0.85}As$ layer. Each layer is $\lambda/4n_r$ thick where $\lambda$ is the oscillation wavelength and $n_r$ is the refractive index of the medium. The paired layers having different composition ratios are alternately laminated to a thickness of 24 periods. The carrier concentration of the lower multilayer reflection film 5 after carbon that is a p-type impurity is doped is $5 \times 10^{18}$ $cm^{-3}$. A lowermost layer 5a of the upper multilayer reflection film 5 is made of AlAs rather than $Al_{0.9}Ga_{0.1}As$ because the lowermost layer 5a is changed to the current confinement/stray capacitance reduction region 4a by a later process.

The reason why the number of periods (number of layers) of the upper multilayer reflection film 5 is smaller than the lower multilayer reflection film 2 is that the difference thus formed causes light to be emitted from the upper side of the substrate 1. In order to reduce the series resistance in the posts, practically, an intermediate (graded) layer is interposed between the p-type $Al_{0.9}Ga_{0.1}As$ layer and the p-type $Al_{0.15}Ga_{0.85}As$ layer of the upper multilayer reflection film 5, the intermediate layer having an intermediate composition ratio between that of the p-type $Al_{0.9}Ga_{0.1}As$ layer and that of the p-type $Al_{0.15}Ga_{0.85}As$ layer. Such an intermediate layer is not illustrated for the sake of simplicity.

The active region 3 has a quantum well structure in which an undoped GaAs quantum well layer having a thickness of 8 nm and an undoped $Al_{0.3}Ga_{0.7}As$ layer having a thickness of 5 nm are alternately laminated. The active region 3 is designed to have light emission in the 850 nm wavelength region.

A spacer layer formed by an undoped $Al_{0.6}Ga_{0.4}As$ layer which is one of the layers forming the active region 3 includes a quantum well structure in the center thereof. The whole spacer layer has a film thickness as large as an integral multiple of $\lambda/n_r$ where $\lambda$ is the oscillation wavelength and $n_r$ is the refractive index of the medium. The above structure causes a standing wave in the active region 3 so that an "anti-node" portion in which the strongest light intensity is available is located in the quantum well layer.

The contact layer 6, which is a p-type GaAs layer, is as thin as 20 nm, and has a carrier concentration of $1 \times 10^{20}$ $cm^{-3}$ after it is doped with carbon serving as the p-type impurity. GaAs has an energy band gap of about 1.4 eV and absorbs light in the 850 nm wavelength radiation emitted from the active layer. However, no problem will arise from the contact layer 6 because it is very thin and far from the active layer 3.

The wafer is removed from a growth chamber and a silicon nitride ($SiN_x$) film is deposited on the entire surface of the waver including the p-type GaAs contact layer by RF sputtering.

Figure 2B:
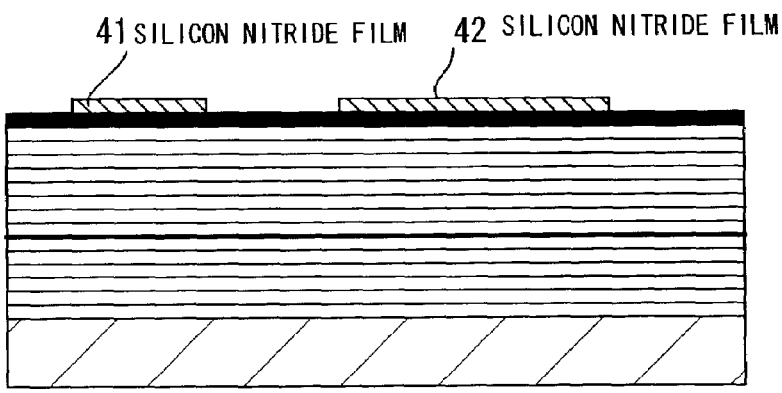

Then, using the photolithography technique, the silicon nitride film is shaped into a circular mask 41 having a diameter of 30 μm and a square mask 42 having a side that is 100 μm long, as shown in FIG. 2B. The square mask 42 is located at a center-to-center distance of 50 μm.

Figure 2C:
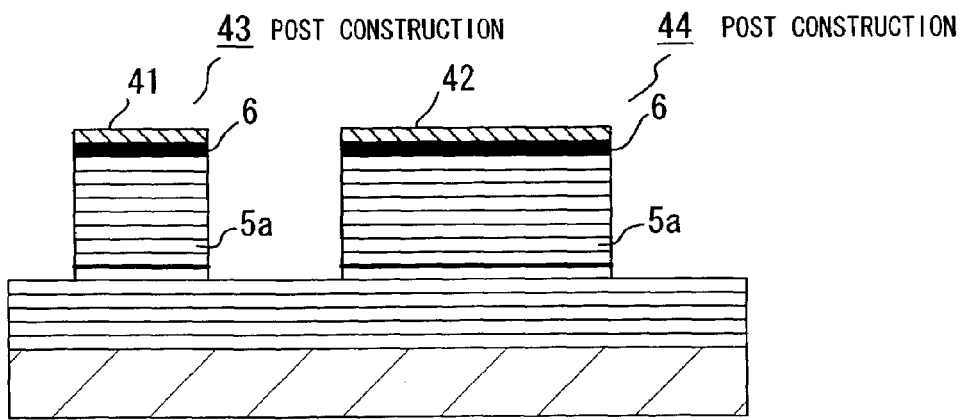

The p-type GaAs contact layer 6 and the upper multilayer reflection film 5 composed of pairs of p-type $Al_{0.9}Ga_{0.1}As$ layer and the p-type $Al_{0.15}Ga_{0.85}As$ layer are dry-etched using a chlorine-based gas with the silicon nitride films 41 and 42 being used as an etching mask. This dry etching results in first and second post constructions 43 and 44 that have a cylinder shape and a square-pole shape, respectively, as shown in FIGS. 1B and 2C. Further, the dry etching is required to expose at least the AlAs layer that is the lowermost layer of the upper multilayer reflection film 5.

Figure 3A:
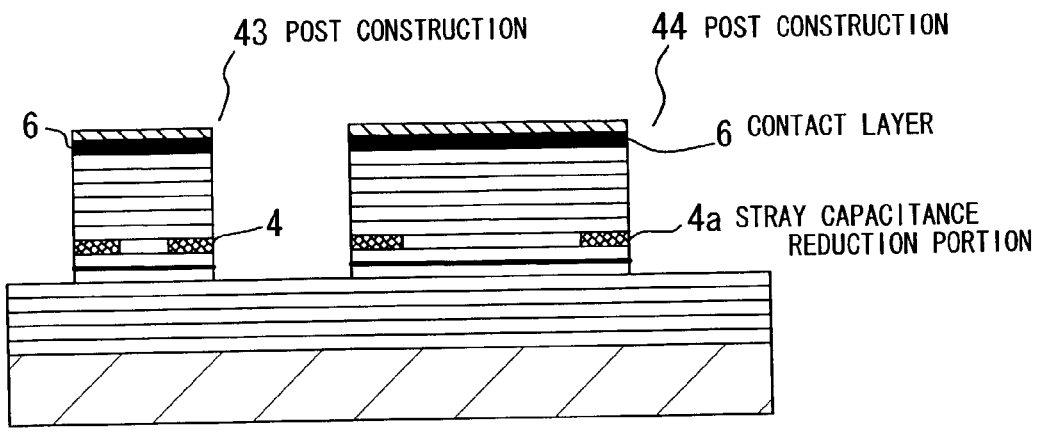
FIGS. 3A, 3B and 3C are cross-sectional views that follow the process shown in FIGS. 2A through 2C.

The two post constructions 43 and 44 thus obtained are subject to a wet oxidization process in which these structures are exposed to moisture vapor at 350° C. for about 20 minutes. The AlAs layer in the upper multilayer reflection film 5 in each of the post constructions 43 and 44 is oxidized from the outer circumference (side surface) thereof, so that it is changed to $Al_2O_3$. Thus, an insulating region (selectively oxidized layer) is formed in the outer circumferential portions of the post constructions 43 and 44, as shown in FIG. 3A. The oxidized portion of the post construction 43 serves as the current confinement layer 4 and that of the post construction 44 serves as the stray capacitance reduction layer 4a.

Then, the whole surface of the wafer (substrate) including the side surfaces of the post constructions 43 and 44 is covered with the silicon nitride film 7 by RF sputtering. Thereafter, the silicon nitride film 7 on the top surface of the cylindrical post construction 43 is etched so as to form a window 45 having a diameter of 20 μm, as shown in FIG.

Figure 3B:
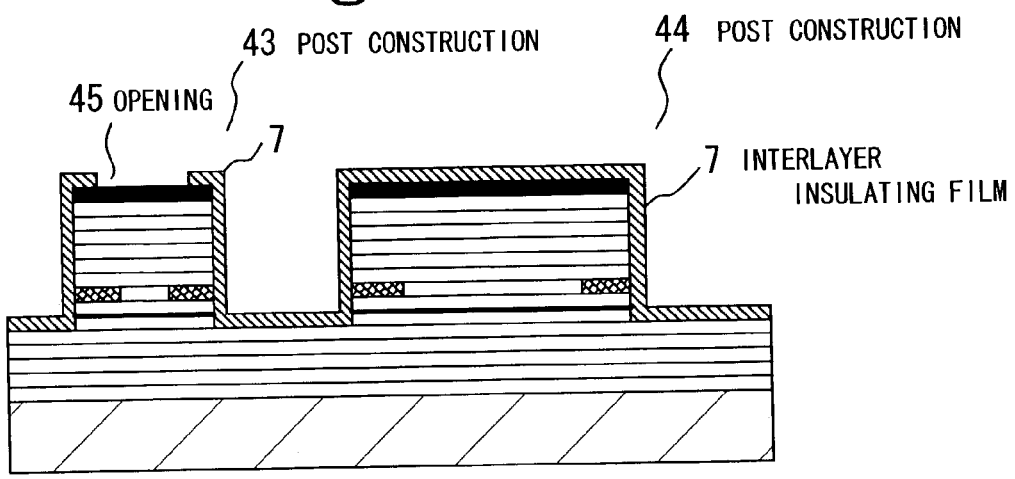

3B. At this time, the top of the square-pole-shaped post construction 44 is not subject to any processing, as shown in FIG. 3B.

Figure 3C:
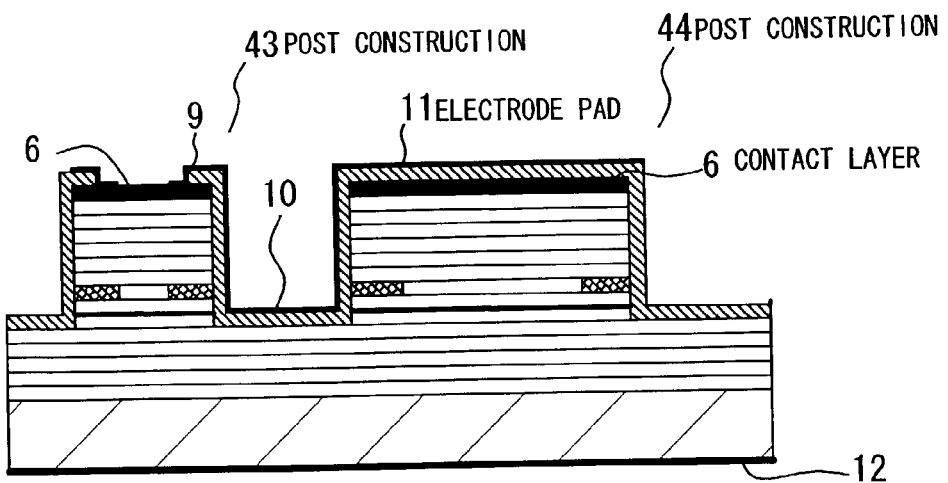

Then, as shown in FIG. 3C, a metal film having a high electrical conductivity, which may, for example, be Ti/Au, is deposited in the vicinity of the window 45 on the top of the cylindrical post construction 43 so as to make an electric contact with the p-type GaAs contact layer 6. The metal film forms the p-side ring-shaped electrode 9, the extraction line between the post side surfaces and the bottom, and the electrode pad 11 on the silicon nitride film 7 located on the top of the square-pole post construction 44.

Finally, a metal film having a high electrical conductivity, which may, for example, be AuGe/Ni/Au, is deposited on the back side of the substrate 1. The metal film serves as the n-side full-surface electrode 12. In this manner, the 850 nm surface emitting semiconductor laser shown in FIGS. 1A and 1B can be fabricated.

The process proceeds to amounting step at which the metal ball 13 is fused to the electrode pad 11 and the bonding wire is extended therefrom.

Figure 8A:
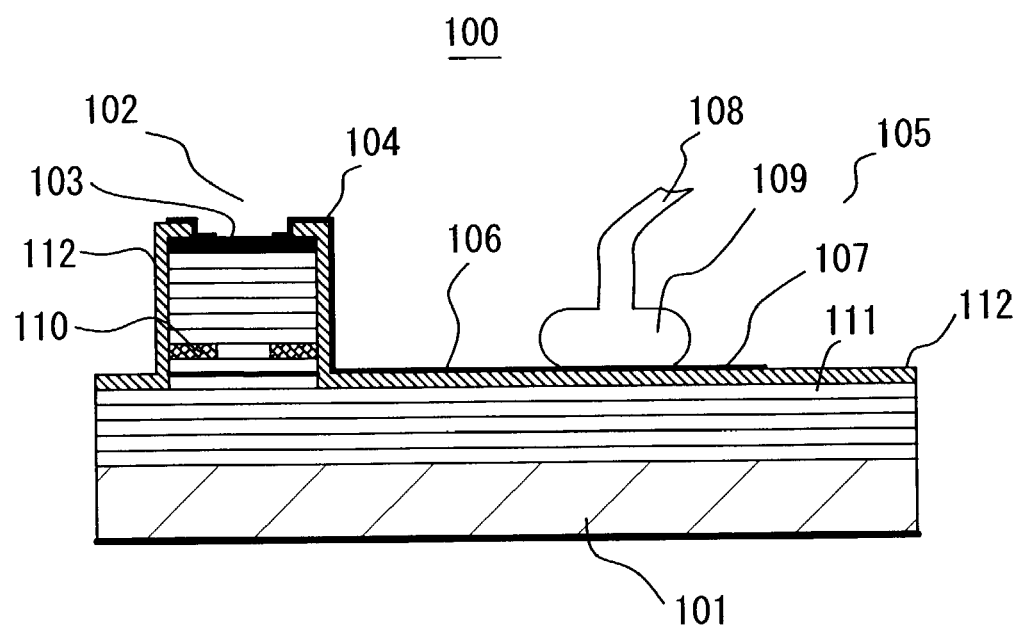
FIG. 8A is a cross-sectional view of a conventional surface emitting semiconductor laser.
Figure 8B:
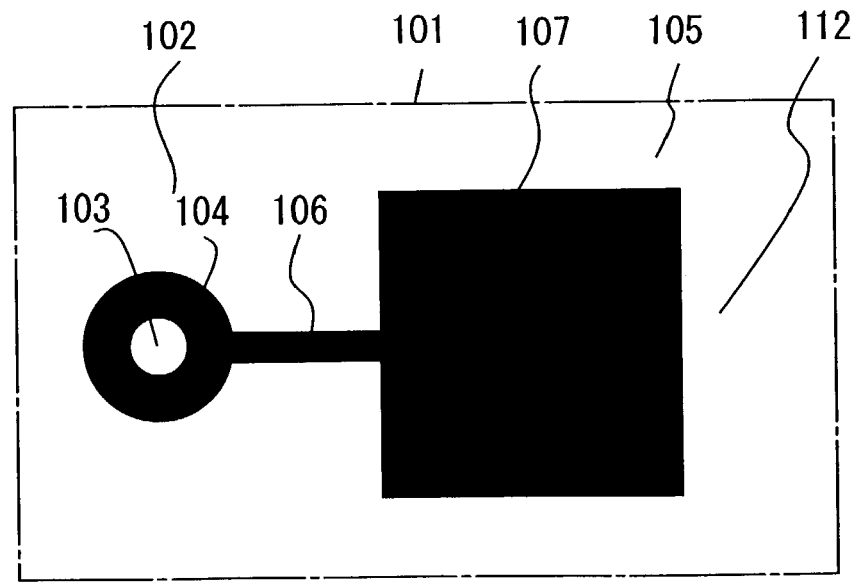
FIG. 8B is a plan view of the semiconductor laser shown in FIG. 8A.

The inventors conducted a pull test of the surface emitting semiconductor laser shown in FIGS. 1A and 1B and the conventional laser shown in FIGS. 8A and 8B. In the pull test, the bonding wires were pulled ten times for each of the lasers. For the conventional laser in which the electrode pad is arranged on the bottom that defines the post construction, a strength of 6.9 g and a standard deviation of 0.62 g were confirmed. In contrast, for the laser shown in FIGS. 1A and 1B, a strength of 8.8 g and a standard deviation of 1.17 g were obtained. Thus, about 30% improvement in strength can be achieved.

The first embodiment of the present invention employs the post construction having a square-pole shape in the electrode pad portion 30 for supplying the laser with current. Alternatively, any shape of the post construction may be employed in the electrode pad portion 30. For example, the post construction having a circular or rectangular transverse section may be employed. It is also possible to provide grooves or trenches on a plane viewed from the upper side of the post construction of the electrode pad portion 30 so that the post construction has multiple posts.

Figures 4A, 4B, 4C:
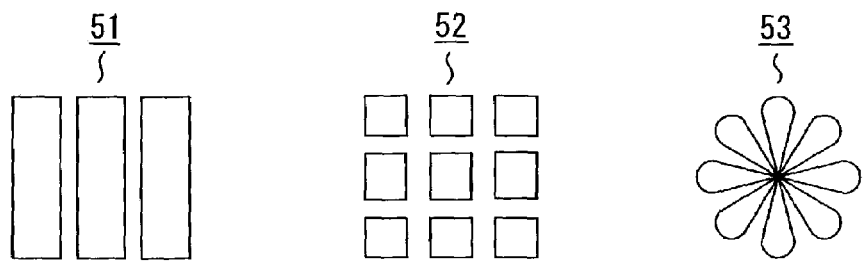
FIGS. 4A, 4B, 4C and 4D are respectively plan views of electrode pad portions of a surface emitting semiconductor laser according to a second embodiment of the present invention.
Figure 4D:
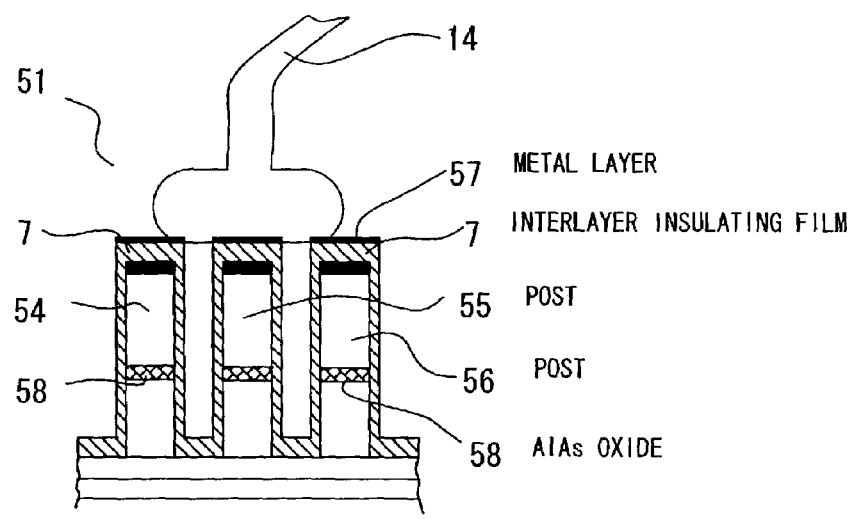

FIGS. 4A through 4D show constructions having segment grooves. FIG. 4A shows a post construction 51 having multiple stripe-like posts. FIG. 4B shows a post construction 52 having multiple posts arranged in grid formation. FIG. 4C shows a post construction having multiple posts arranged in radial formation. FIG. 4D is a cross-sectional view of the stripe-like post construction 51 shown in FIG. 4A. Three posts 54, 55 and 56 are arranged side by side on the substrate, and are covered by the interlayer insulating film 7. A metal layer 57 is provided to each of the posts 54, 55 and 56 via the interlayer insulating film 7. The metal layer 57 is connected to the contact layer 6 of the laser portion 20, and forms electrode pad surfaces on the top of the post construction 51. In FIG. 4D, the metal layer 57 is provided on only the top of the post construction 51. Alternatively, the metal layer 57 may be provided to the sidewalls of the posts 54, 55 and 56 of the post construction 51.

In the case where the post construction of the electrode pad portion 30 has divided posts, an increased total area of AlAs oxide layers of the individual segmented posts can be obtained even when the total area of the top surfaces of the individual posts is equal to the area of the top surface of the single-post construction. This is because the circumferential length of the post construction increases due to post division. If the diameter (width) of the individual posts is smaller than that of the laser portion 20, the AlAs oxide layers 58 may be totally oxidized. This reduces the composite capacitance of the electrode pad portion 30 and improves the responsibility.

The area necessary for wire bonding depends on the diameter of the wire and that of the metal ball attached thereto. Therefore, the electrode pad 30 formed by the post construction having multiple posts segmented by the grooves or trenches is effective means for increasing the area of the stray capacitance reduction portion with respect to the minimum electrode pad area necessary for wire bonding. The metal electrode may be provided on only the tops of the posts. Alternatively, the metal electrode may be additionally provided on the grooves and the sidewalls of the posts, as shown in FIG. 4D. In the pull test conducted by the inventors, the arrangement of the stripe type shown in FIG. 4A has a strength of 5–7 g, while the conventional arrangement shown in FIGS. 8A and 8B has a strength of 2–7 g. The arrangement of the stripe type shown in FIG. 4A has a smaller variation of strength than that shown in FIGS. 8A and 8B, and provides more secured bonding strength.

A description will now be given of the electrostatic capacitance of the surface emitting semiconductor laser according to the present embodiment.

The electrostatic capacitance C that develops between opposing conductive plates parallel to each other is expressed as follows:

$$C = \epsilon_o \epsilon_s A/L$$

Where $\epsilon_o$ is the dielectric constant of a vacuum ($8.854 \times 10^{-12}$ F/m), $\epsilon_s$ is the material-specific relative dielectric constant, A is the area of the conductors (plates), and L is the distance between the conductors.

The composition of the AlAs oxide is substantially equivalent to $Al_2O_3$, and the relative dielectric constant thereof is estimated as about 10. $SiN_x$ used as the interlayer insulating film employed in the present embodiment is approximately 6.5. When the original AlAs layer is 40 nm thick, it may be considered that the AlAs oxide layer has increased by approximately 10% from the original AlAs layer and is therefore $4.4 \times 10^{-8}$ m thick. The $SiN_x$ interlayer insulating film is $3 \times 10^{-7}$ m (=0.3 μm) thick.

Now, a description will be given of three different types that have the same layer structure but have different areas. The first type has only the AlAs oxide that corresponds to the laser portion. The second type has only the interlayer film that corresponds to the electrode pad portion. The third type has both the AlAs oxide and the interlayer film.

The first and second types having comparatively simple layer structures respectively have electrostatic capacitances per unit area of $2.01 \times 10^{-3}$ F/m² and $1.92 \times 10^{-4}$ F/m².

Figure 5A:
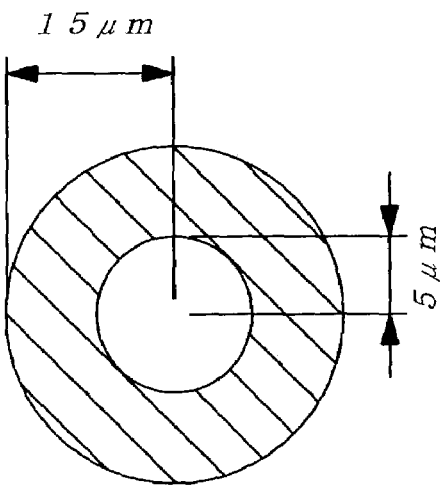
FIG. 5A shows an AlAs oxide region.

Next, the electrostatic capacitances resulting from the laser portion 20 and the electrode pad portion 30 of the surface emitting laser according to the above-mentioned first embodiment of the present invention are calculated. FIG. 5A shows an example of the first type in which the top of the laser portion is illustrated. A hatched area denotes an AlAs oxide region, which has an inside diameter of about 5 μm and an outside diameter of 15 μm. The product of the area by the electrostatic capacitance per unit area is approximately equal to 1.26 pF.

Figure 5B:
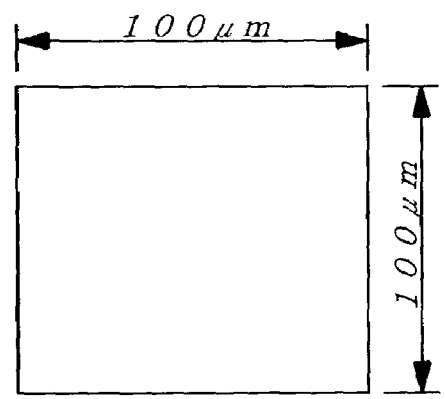
FIG. 5B shows a region of an interlayer insulating film conventionally used.

FIG. 5B shows an example of the second type, in which the interlayer insulating film of the conventional electrode pad portion is depicted. The interlayer insulating film has a side of 100 μm and an electrostatic capacitance of about 1.92 pF.

Figure 5C:
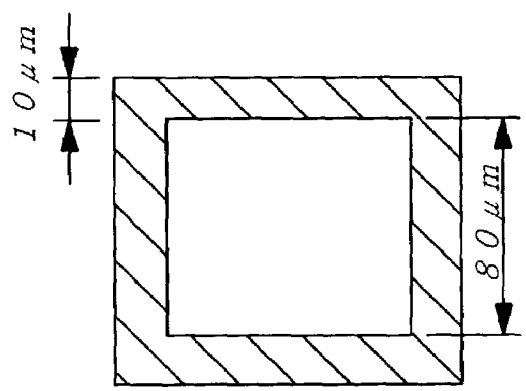
FIG. 5C shows a region of an AlAs oxide and an interlayer insulating film employed in the second embodiment of the present invention.

FIG. 5C shows an example of the third type, in which the interlayer insulating film and AlAs oxide region of the electrode pad portion of the laser according to the first embodiment of the present invention are illustrated. The third type can be understood so that the AlAs oxide and the interlayer insulating film are electrically connected in series. A hatched area denotes the AlAs oxide region. The outer side of the whole area has a 100 µm, and the AlAs oxide region has a width of 10 µm. The construction shown in FIG. 5C has a reduced electrostatic capacitance of about 1.53 pF, as compared to the conventional construction.

An electrostatic capacitance of about 1.25 pF can be obtained for the post construction of the electrode pad portion having multiple stripe-like posts (FIG. 4A) each having a width of 20 µm, and is reduced to 35% of that for the conventional construction shown in FIG. 5B. In this case, it is assumed that the electrode is provided on only the top surfaces of the individual posts in FIG. 4A.

The present invention is not limited to the above-mentioned first embodiment, but includes various variations and modifications, some of which will now be described below.

Figure 6:
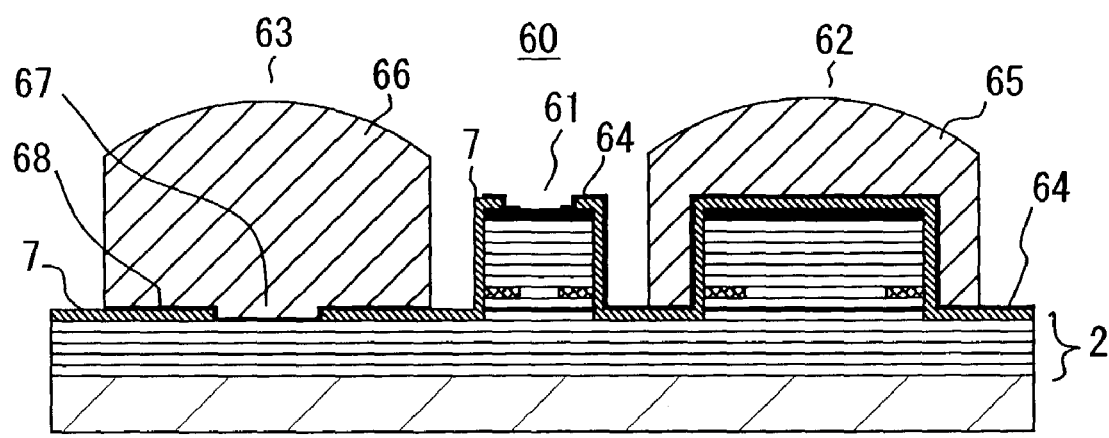
FIG. 6 is a cross-sectional view of a surface emitting semiconductor laser according to a third embodiment of the present invention.

FIG. 6 is a cross-sectional view of a surface emitting semiconductor laser in which the post construction of the electrode pad portion is applied to a bump electrode. A surface emitting semiconductor laser 60 shown in FIG. 6 includes a laser portion 61 and first and second electrode portions 62 and 63. The laser portion 61 and the electrode portion 62 respectively have first and second post constructions that are separated from each other by a groove and are the same as the corresponding post constructions of the first embodiment of the present invention shown in FIGS. 1A and 1B. A metal layer 64 is provided so that it contacts the p-type contact layer of the laser portion 61 and covers the second post construction. A bump electrode 65 is provided on the metal layer 64 and covers the second post construction of the electrode portion 62.

The second electrode portion 63 has a bump electrode 66, which is formed on the post bottom formed by etching for defining the post constructions. The semiconductor layer exposed by etching is part of the n-type semiconductor multilayer reflection film, on which the interlayer insulating film 7 having an opening or aperture 67 is provided. A metal layer 68 is deposited on the exposed portion of the semiconductor layer via the aperture 67. The bump electrode 66 is formed on the metal layer 68. The bump electrode 66 has a height approximately equal to that of the bump electrode 65.

The first and second electrodes 62 and 63 have substantially the same height, and may be used as flip-chip electrodes. This enables flip-chip mounting in which electrode terminals are arranged on a single surface of the semiconductor substrate. In this case, the laser emitting aperture may be formed on the back surface of the semiconductor substrate. Preferably, the number of periods of p-type semiconductor multilayer reflection film is larger than that of the n-type semiconductor multilayer reflection film, and a groove that corresponds to the laser emitting aperture is formed in the semiconductor substrate.

Figure 7:
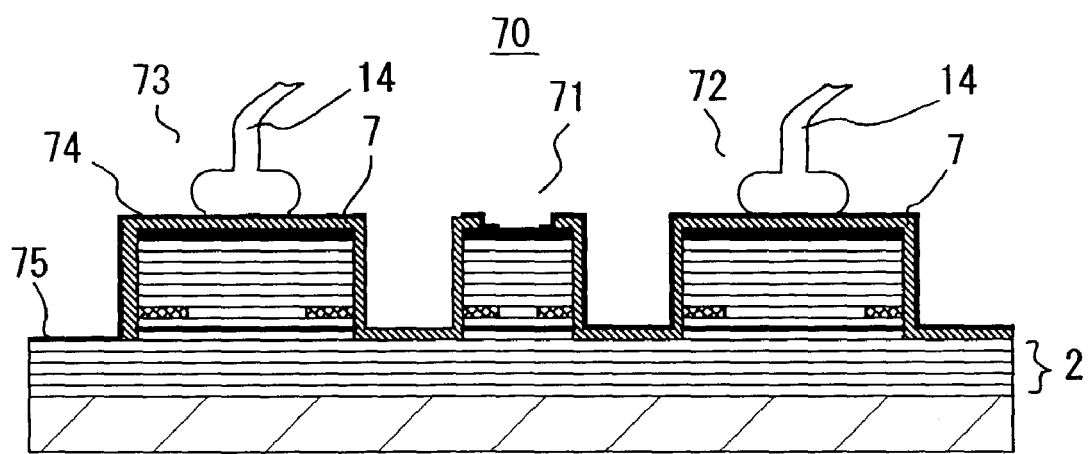
FIG. 7 is a cross-sectional view of a surface emitting semiconductor laser according to a fourth embodiment of the present invention.

FIG. 7 is a cross-sectional view of a surface emitting semiconductor laser in which the n-type back-side electrode of the laser is formed by a wire bonding electrode. A surface emitting semiconductor laser 70 includes a laser portion 71, and first and second electrode pad portions 72 and 73. The laser portion 71 and the first electrode 72 are the same as the corresponding those of the first embodiment of the present invention shown in FIGS. 1A and 1B.

The surface emitting semiconductor laser 70 includes a third post construction for forming the second electrode pad portion 73. The third post construction has the same basic structure as that of the second post construction of the first electrode pad 72. The post construction is covered by the interlayer insulating film 7, on which an electrode pad 74 formed by a metal layer 75 is provided. The metal layer 75 is connected to part of the n-type semiconductor multilayer reflection film 2 exposed by defining the post constructions. The third post construction includes an AlAs oxide region The second electrode pad portion 73 has a reduced electrostatic capacitance and a sufficient adhesive strength of the electrode surface subject to wire bonding. The electrode terminals of the laser shown in FIG. 7 are arranged on a single surface of the semiconductor substrate. The laser emitting aperture may be provided on the back surface of the semiconductor substrate.

According to one aspect of the present invention, the electrode portion (electrode pad portion) is designed to have the post construction on which the conductive layer is provided. It is therefore possible to reduce the stray capacitance coupled to the electrode portion and to greatly improve the high-speed modulation performance of the laser. Particularly, the electrode pad includes the semiconductor oxide region having the same structure as that of the current confinement layer of the laser portion. It is therefore possible to further reduce the stray capacitance.

According to another aspect of the present invention, the laser has the conductive layer that is used for wire bonding and is provided on the top surface of the post constriction via the insulating film, and the bonding surface provided on the top surface of the post that is not subject to etchant at the time of forming the post constructions. It is therefore possible to realize the good adhesiveness between the semiconductor surface and the insulating film and prevent wires from being removed at the time of bonding and to realize uniform performance over lasers and improve the yield.

According to one aspect of the present invention, surface emitting semiconductor laser includes: a substrate (1); a laser portion (20) having a first post construction that is provided on the substrate and has a contact region on a top surface thereof, an electrode portion (30) having a second post construction provided on the substrate, the electrode portion including a conductive layer (6) electrically connected to the contact region and extends therefrom. The electrode portion has the post structure on which the conductive layer is provided. It is therefore possible to reduce the stray capacitance resulting from the electrode portion and improve the high-speed modulation performance. Since the electrode surface is formed on the top surface of the post structure that is not subject to etchant at the time of forming the post construction, the electrode surface has reliable strength. Preferably, the electrode surface may be used as a bonding pad plane.

The surface emitting semiconductor laser may be configured so that the first post construction includes first and second semiconductor reflection films (2, 5) provided on the substrate, and an active region interposed between the first and second semiconductor reflection films; and the second post construction includes a semiconductor layer having a layer structure identical to that of the first and second semiconductor reflection films and the active region. The second post construction may be covered with an insulating film (7) on which the conductive layer is provided on a top surface of the second post structure. Preferably, the laser portion includes a current confinement layer (4) that is an oxidized semiconductor layer in the first post construction, and the electrode portion includes a semiconductor layer (4a) that is partially oxidized in the second post construction. It is therefore possible to reduce the stray capacitance coupled to the electrode portion. The first semiconductor multilayer reflection film may contain an AlGaAs layer of a first conduction type, and the second semiconductor multilayer reflection film may contain an AlGaAs layer of a second conduction type. Preferably, the first and second post structures are separate from each other. In other words, the first and second post structures are independent of each other.

According to another aspect of the present invention, the surface emitting semiconductor laser includes: a first multilayer reflection film (5), an oxidization control layer (4), an active layer (3) and a second multilayer reflection film (2) that are laminated; a laser portion (20) that includes a first post construction formed by removing, in a periphery thereof, a range of at least the first multilayer reflection film to the oxidization control layer and has a first conduction type contact region formed on a top surface of the first multilayer reflection film; and an electrode portion (30) that includes a second post construction formed by removing, in a periphery thereof, a range of at least the first multilayer reflection film to the oxidization control layer and has an electrode layer connected to the first conduction type contact region formed on the first multilayer reflection film via an insulating film. The second post construction of the electrode portion reduces the stray capacitance coupled therewith and improves the strength thereof. The second post construction may have multiple posts (51, 52, 53). This arrangement further reduces the stray capacitance in the second post construction. Although the second post construction includes the multilayer reflection films and the oxidization control layer, these layers do not function as they are but are merely included so as to realize the same layer structure as that of the first post construction of the laser portion.

According to another aspect of the present invention, the surface emitting semiconductor laser includes: a laser portion (20) that is provided on a semiconductor substrate (1) and has a current confinement portion (4) defined by selectively oxidizing part of a semiconductor layer containing aluminum; an electrode portion (30) for supplying the laser portion with current, the electrode portion having an oxide region (4a) defined by oxidizing another part of the semiconductor layer containing aluminum, the current confinement portion being separate from the oxide region. The electrode portion includes the oxide region and is separate from the current confinement portion, so that the stray capacitance of the electrode portion can be reduced and high-speed modulation can be achieved. Preferably, the electrode portion comprises an insulating layer (7) provided above the oxide region and a conductive layer (11) formed on the insulating layer, the conductive layer providing an electrode surface. The electrode portion may be spaced apart from the laser portion via a groove. Preferably, the conductive layer comprises an electrode pad (11) for wire bonding.

According to a further aspect of the present invention, the surface emitting semiconductor laser includes: a first multilayer reflection film (5), an oxidization control layer (4), an active layer (3) and a second multilayer reflection film (2) that are laminated; a laser portion (71) that includes a first post construction formed by removing, in a periphery thereof, a range of at least the first multilayer reflection film to the oxidization control layer and has a first conduction type contact region formed on a top surface of the first multilayer reflection film; a first electrode portion (72) that includes a second post construction formed by removing, in a periphery thereof, a range of at least the first multilayer reflection film to the oxidization control layer, the first electrode portion having an electrode layer provided on a top surface of the first multilayer reflection film via an insulation film and being connected to the first conduction type contact region; a second conduction type contact region (75) formed on a side of the second multilayer reflection film; and a second electrode portion (73) that includes a third construction formed by removing, in a periphery thereof, a range of at least the first multilayer reflection film to the oxidization control layer and has an electrode layer connected to the second conduction type contact region formed on the first multilayer reflection film via the insulating film and to the second conduction type contact region. The above arrangement reduces the stray capacitances resulting from the first and second electrode portions. Since the first and second electrode portions are arranged on the same surface, these parts may be formed easily. It is also possible to form a laser emitting aperture on a side of the substrate opposite to the side on which the electrode portions are formed. At least one of the first and second electrode portions may have multiple posts (51, 52, 53) so as to divide the electrode layer into parts.

According to yet another aspect of the present invention, the method of fabricating a surface emitting semiconductor laser includes the steps of: forming a multilayer structure (2, 3, 4, 5) on a substrate (1), the multilayer structure including a semiconductor layer (4, 4a) containing aluminum and semiconductor layers (2, 5) of first and second conduction types; forming first and second post constructions (43, 44) on the substrate by etching the multilayer structure so that a side surface of the semiconductor layer containing aluminum is exposed; oxidizing the semiconductor layer (4, 4a) containing aluminum included in the first and second post constructions from side surfaces thereof; forming an insulating film (7) on the substrate including the first and second post constructions; removing the insulating film from a top surface of the first post construction (43) so that part of the semiconductor layer of the first conduction type in the first post construction is exposed; and depositing a metal layer (9, 10, 11) extending from an exposed portion of the semiconductor layer of the first conduction type in the first post construction to a top of the second post construction. The method may further include a step of bonding a wire (14) to the metal layer on the top of the second post construction. Alternatively, the method may include a step of providing a metal bump (62) on the metal layer on the top of the second post construction.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A surface emitting semiconductor laser comprising:
a substrate;
a laser portion having a first post construction that is provided on the substrate and has a contact region on a top surface thereof; and
an electrode portion having a second post construction provided on the substrate,
the first post construction and the second post construction being isolated from each other;
the electrode portion including a conductive layer electrically connected to the contact region and extends therefrom along side surfaces of the first post construction and the second post construction.

2. The surface emitting semiconductor laser as claimed in claim 1, wherein:
the first post construction includes first and second semiconductor reflection films provided on the substrate, and an active region interposed between the first and second semiconductor reflection films; and
the second post construction includes a semiconductor layer having a layer structure identical to that of the first and second semiconductor reflection films and the active region.

3. The surface emitting semiconductor laser as claimed in claim 1, wherein the second post construction is covered with an insulating film on which the conductive layer is provided on a top surface of the second post structure.

4. The surface emitting semiconductor laser as claimed in claim 3, wherein the insulating film is provided on a contact layer on a top of the second post construction.

5. The surface emitting semiconductor laser as claimed in claim 1, wherein:
the laser portion includes a current confinement layer that is an oxidized semiconductor layer in the first post construction; and
the electrode portion includes a semiconductor layer that is partially oxidized in the second post construction.

6. The surface emitting semiconductor laser as claimed in claim 1, wherein the first and second post constructions have a mesa shape.

7. The surface emitting semiconductor laser as claimed in claim 1, wherein the second post construction has a semiconductor layer that provides an electrode surface that is connected to a bonding wire or metal bump.

8. A surface emitting semiconductor laser comprising:
a first multilayer reflection film, an oxidization control layer, an active layer and a second multilayer reflection film that are laminated;
a laser portion that includes a first post construction formed by removing, in a periphery thereof, a range of at least the first multilayer reflection film to the oxidization control layer and has a first conduction type contact region formed on a top surface of the first multilayer reflection film; and
an electrode portion that includes a second post construction formed by removing, in a periphery thereof, a range of at least the first multilayer reflection film to the oxidization control layer and has an electrode layer connected to the first conduction type contact region formed on the first multilayer reflection film via an insulating film, and extends therefrom along side surfaces of the first post construction and the second post construction,
the first post construction and the second post construction being isolated from each other.

9. A surface emitting semiconductor laser comprising:
a first multilayer reflection film, an oxidization control layer, an active layer and a second multilayer reflection film that are laminated;
a laser portion that includes a first post construction formed by removing, in a periphery thereof, a range of at least the first multilayer reflection film to the oxidization control layer and has a first conduction type contact region formed on a top surface of the first multilayer reflection film; and
an electrode portion that includes a second post construction formed by removing, in a periphery thereof, a range of at least the first multilayer reflection film to the oxidization control layer and has an electrode layer connected to the first conduction type contact region formed on the first multilayer reflection film via an insulating film, wherein the second post construction comprises multiple posts.

10. A surface emitting semiconductor laser comprising:
a laser portion that is provided on a semiconductor substrate and has a first oxide region defined by selectively oxidizing part of a semiconductor layer containing aluminum;
an electrode portion for supplying the laser portion with current; and
a second oxide region defined by oxidizing another part of the semiconductor layer containing aluminum,
the second oxide region being separate from the first oxide region, and
the first oxide region being a current confinement portion, and the second oxide region being a stray capacitance reducing portion in the electrode portion.

11. The surface emitting semiconductor laser as claimed in claim 10, wherein the electrode portion comprises an insulating layer provided above the first oxide region and a conductive layer formed on the insulating layer, the conductive layer providing an electrode surface.

12. The surface emitting semiconductor laser as claimed in claim 10, wherein the electrode portion is spaced apart from the laser portion via a groove.

13. The surface emitting semiconductor laser as claimed in claim 11, wherein the conductive layer comprises an electrode pad for wire bonding.

14. A surface emitting semiconductor laser comprising:
a first multilayer reflection film, an oxidization control layer, an active layer and a second multilayer reflection film that are laminated;
a laser portion that includes a first post construction formed by removing, in a periphery thereof, a range of at least the first multilayer reflection film to the oxidization control layer and has a first conduction type contact region formed on a top surface of the first multilayer reflection film;
a first electrode portion that includes a second post construction formed by removing, in a periphery thereof, a range of at least the first multilayer reflection film to the oxidization control layer, the first electrode portion having an electrode layer provided on a top surface of the first multilayer reflection film via an insulation film and being connected to the first conduction type contact region;
a second conduction type contact region formed on a side of the second multilayer reflection film; and
a second electrode portion that includes a third construction formed by removing, in a periphery thereof, a range of at least the first multilayer reflection film to the oxidization control layer and has an electrode layer connected to the second conduction type contact region formed on the first multilayer reflection film via the insulating film and to the second conduction type contact region.

15. The surface emitting semiconductor laser as claimed in claim 14, wherein at least one of the first and second electrode portions comprises multiple posts so as to divide the electrode layer into parts.

* * * * *